(12) United States Patent
Cadag et al.

(10) Patent No.: US 10,529,672 B2
(45) Date of Patent: Jan. 7, 2020

(54) PACKAGE WITH INTERLOCKING LEADS AND MANUFACTURING THE SAME

(71) Applicant: STMicroelectronics, Inc., Calamba (PH)

(72) Inventors: Aaron Cadag, Calamba (PH); Lester Joseph Belalo, Cabuyao (PH); Ela Mia Cadag, Calamba (PH)

(73) Assignee: STMICROELECTRONICS, INC., Calamba (PH)

( * ) Notice: Subject to any disclaimer, the term of this patent is extended or adjusted under 35 U.S.C. 154(b) by 4 days.

(21) Appl. No.: 15/693,277

(22) Filed: Aug. 31, 2017

(65) Prior Publication Data

US 2019/0067212 A1    Feb. 28, 2019

(51) Int. Cl.
| | |
|---|---|
| *H01L 21/56* | (2006.01) |
| *H01L 23/00* | (2006.01) |
| *H01L 23/495* | (2006.01) |
| *H01L 23/31* | (2006.01) |

(Continued)

(52) U.S. Cl.
CPC ........ *H01L 23/562* (2013.01); *H01L 21/4825* (2013.01); *H01L 21/4832* (2013.01);
(Continued)

(58) Field of Classification Search
CPC ..... H01L 21/4825; H01L 21/48; H01L 21/78; H01L 21/56; H01L 21/4832; H01L 21/565; H01L 21/561; H01L 23/00; H01L 23/495; H01L 23/31; H01L 23/48; H01L 23/3114; H01L 23/562; H01L 23/4952; H01L 23/449541; H01L 23/49548; H01L 23/49582; H01L 23/3107; H01L 23/3142;
(Continued)

(56) References Cited

U.S. PATENT DOCUMENTS

| | | | |
|---|---|---|---|
| 6,403,402 B1 * | 6/2002 | Ohsawa | ............ H01L 21/4828 |
| | | | 438/123 |
| 6,585,905 B1 | 7/2003 | Fan et al. | |

(Continued)

*Primary Examiner* — Chuong A Luu
(74) *Attorney, Agent, or Firm* — Seed IP Law Group LLP

(57) ABSTRACT

A semiconductor package formed utilizing multiple etching steps includes a lead frame, a die, and a molding compound. The lead frame includes leads and a die pad. The leads and the die pad are formed from a first conductive material by the multiple etching steps. More specifically, the leads and the die pad of the lead frame are formed by at least three etching steps. The at least three etching steps including a first etching step, a second undercut etching step, and a third backside etching step. The second undercut etching step forming interlocking portions at an end of each lead. The end of the lead is encased in the molding compound. This encasement of the end of the lead with the interlocking portion allows the interlocking portion to mechanically interlock with the molding compound to avoid lead pull out. In addition, by utilizing at least three etching steps the leads can be formed to have a height that is greater than the die pad of the lead frame. This differential in height reduces the span of wires used to form electrical connections within the semiconductor package. These reductions in the span of the wires reduces the chances of wire to wire and wire to die short circuiting because the wire sweep of the wires is reduced when the molding compound is placed.

23 Claims, 10 Drawing Sheets

(51) Int. Cl.
  *H01L 21/48* (2006.01)
  *H01L 21/78* (2006.01)
(52) U.S. Cl.
  CPC ............ *H01L 21/565* (2013.01); *H01L 21/78* (2013.01); *H01L 23/3114* (2013.01); *H01L 23/4952* (2013.01); *H01L 23/49541* (2013.01); *H01L 23/49548* (2013.01); *H01L 23/49582* (2013.01); *H01L 21/561* (2013.01); *H01L 23/3107* (2013.01); *H01L 23/3142* (2013.01); *H01L 23/49513* (2013.01); *H01L 2224/32145* (2013.01); *H01L 2224/32245* (2013.01); *H01L 2224/48091* (2013.01); *H01L 2224/73265* (2013.01); *H01L 2224/97* (2013.01); *H01L 2924/181* (2013.01)
(58) Field of Classification Search
  CPC ..... H01L 23/49513; H01L 2224/32245; H01L 2224/97; H01L 2224/48091; H01L 2224/73265; H01L 2924/181

USPC .......................... 257/669; 438/123, 106, 121
  See application file for complete search history.

(56) References Cited

U.S. PATENT DOCUMENTS

| | | | |
|---|---|---|---|
| 2005/0218499 A1* | 10/2005 | Chang ................. | H01L 21/4821 257/690 |
| 2005/0263864 A1* | 12/2005 | Islam .................. | H01L 21/4832 257/676 |
| 2008/0258278 A1* | 10/2008 | Ramos ................... | H01L 24/40 257/676 |
| 2010/0001224 A1* | 1/2010 | Edgar ..................... | F01L 1/462 251/337 |
| 2011/0001224 A1* | 1/2011 | San Antonio ....... | H01L 23/3121 257/666 |
| 2012/0241922 A1* | 9/2012 | Pagaila ............... | H01L 21/4832 257/659 |

* cited by examiner

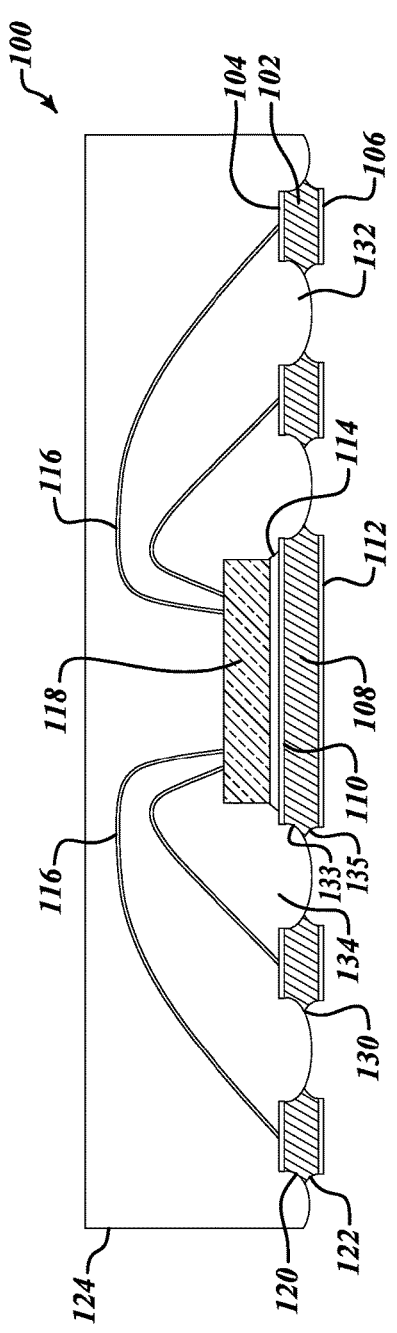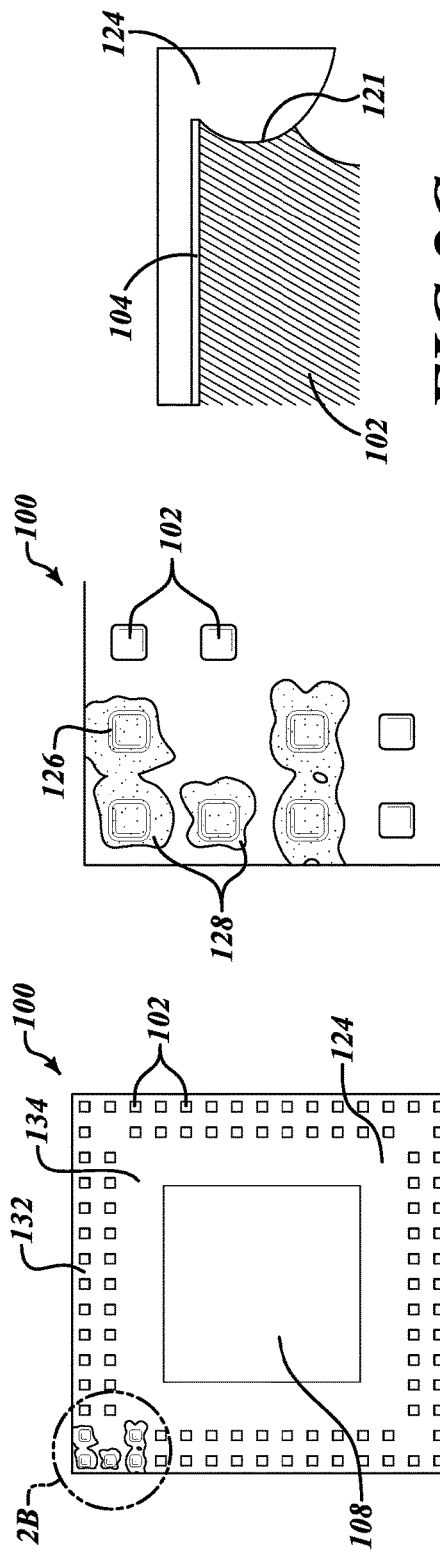

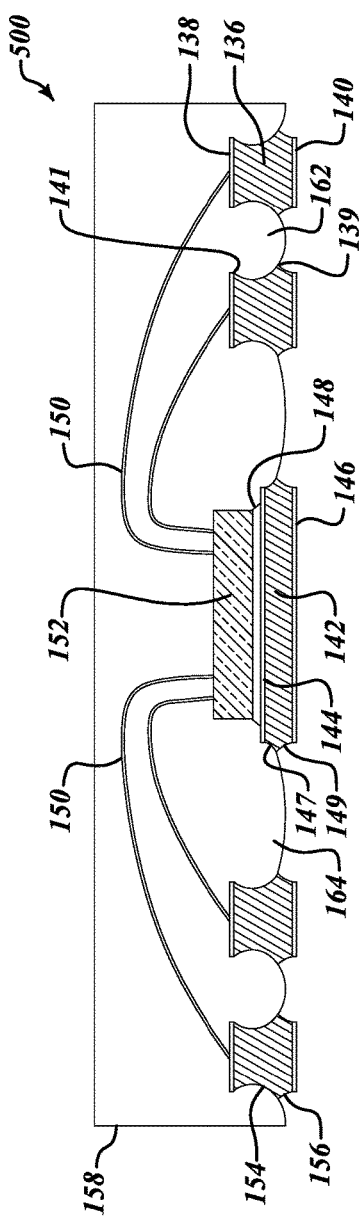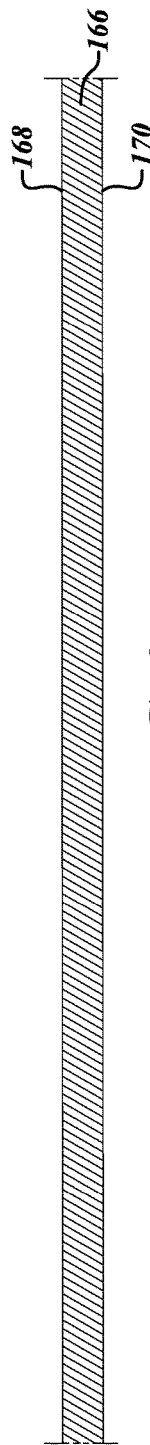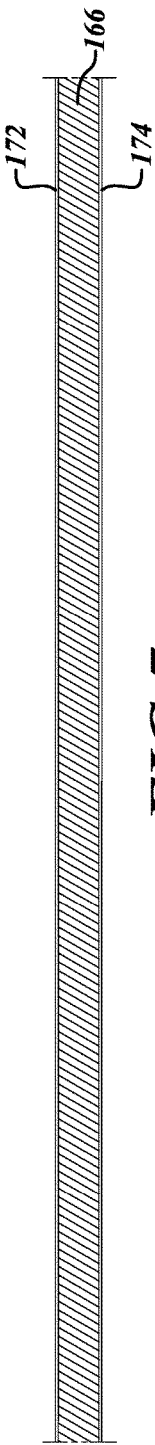

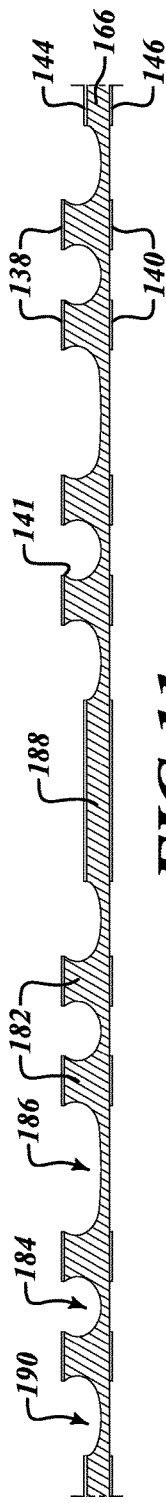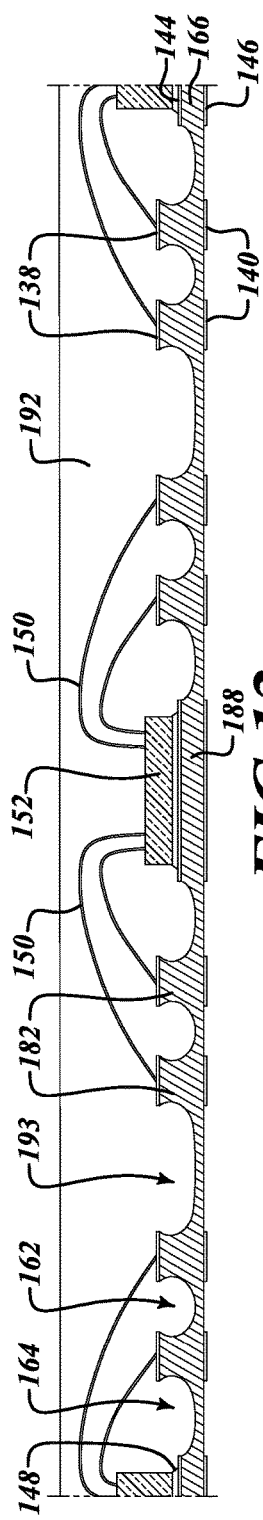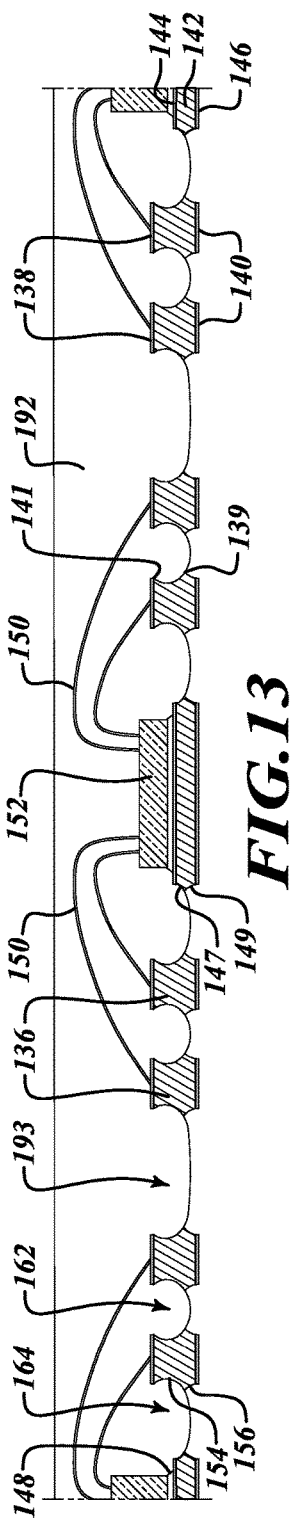

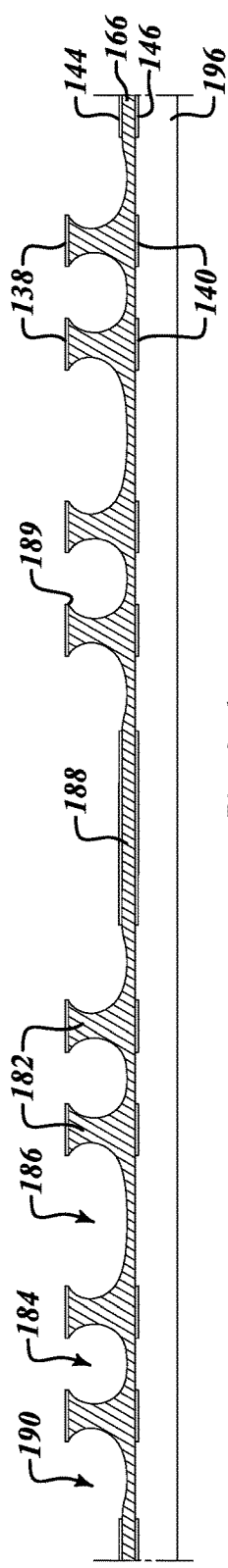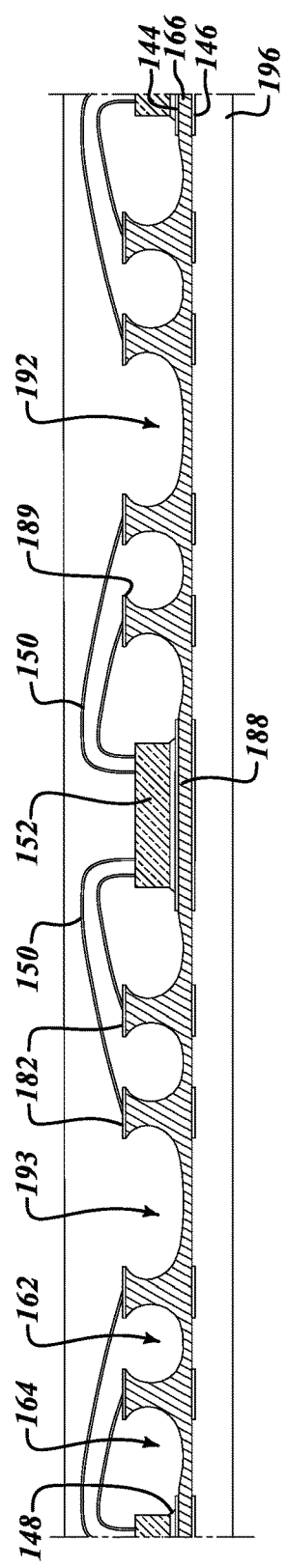

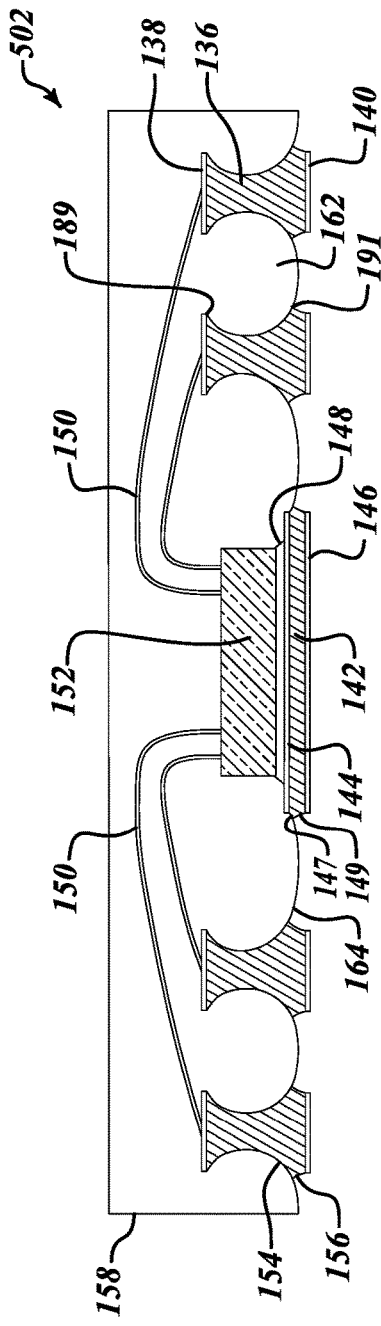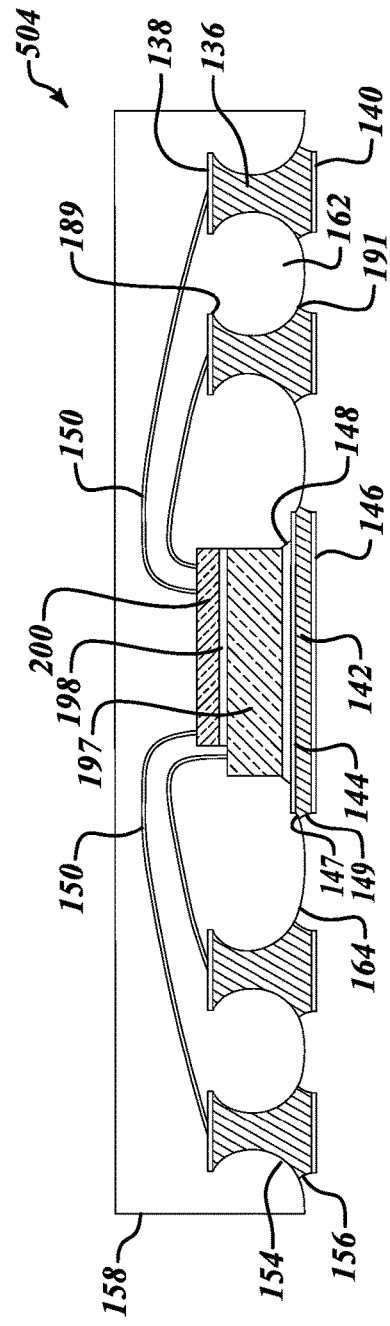

PACKAGE WITH INTERLOCKING LEADS AND MANUFACTURING THE SAME

BACKGROUND

Technical Field

The present disclosure is directed to a semiconductor package and a method of manufacturing the semiconductor package having leads that include at least one interlocking portion to prevent lead pull out.

Description of the Related Art

As consumer demand increases for semiconductor packages, manufacturers face significant challenges to manufacture and form packages that are able to withstand external stresses and forces that may break the semiconductor package. For example, external stresses may be a result from being dropped or external forces may be a result of transporting the semiconductor packages. These external stresses and forces may result in lead pull out causing semiconductor packages to be less efficient or completely fail. Additionally, as electronic devices get thinner, manufacturers face significant challenges to reduce the size of semiconductor packages while avoiding defects in the packages that may lead to short circuiting or other failures. One such cause of short circuiting, resulting in a faulty semiconductor package, is wire to wire short circuiting. Another cause of short circuiting is wire to die short circuiting.

One method of forming a semiconductor package is by starting with a lead frame made of a conductive material with a uniform thickness and blanket plating it on both sides with a selective chemically resistant conductive material forming layers of the selective chemically resistant conductive material. Then portions of the layers of selective chemically resistant conductive material are removed to expose portions of the conductive material and leave areas of the conductive material covered by the selective chemically resistant conductive material. The conductive material with the selective chemically resistant conductive material areas is then etched on one side with a chemical that will etch the lead frame, but not the selective chemically resistant conductive material. This chemical etching creates individual leads. After the first chemical etching, a die is coupled to the lead frame. Then electrical connections are formed by wires between the die and the leads. After the electrical connections are formed and the die is in place, a molding compound is placed encasing the die, the electrical connections, and the leads. After the molding compound is allowed to cure, a chemical back-etching is done to the conductive material to physically and electrically separate the leads and the die pads from each other. This may be done on a large scale to produce hundreds, thousands, or any number of semiconductor packages in a single manufacturing batch.

In some instances, when utilizing the above method the etching of the lead frame and leads may result in a lead that has a cross section of the type as illustrated in FIG. 2C.

BRIEF SUMMARY

The present disclosure provides semiconductor packages formed by utilizing a first conductive material and performing multiple etching steps to form leads and die pads of lead frames of the semiconductor packages. The first conductive material is a layer or a base of the first conductive material with a first and a second side. Furthermore, the layer or base of the first conductive material has a thickness. The first and second sides of the first conductive material are both covered with a layer of a second conductive material. These layers of the second conductive material may be resistant to chemicals used in a chemical bath to etch away portions of the first conductive material. Once the first and second side of the first conductive material is covered with a respective layer of the second conductive material, areas of the layers of the second conductive material are removed by an etching step forming a desired pattern. More specifically, the etching step forms areas of the second conductive material from the layers of the second conductive material on the first and second sides of the first conductive material. At locations where the layers of the second conductive material have been etched away, areas of the first conductive material are exposed. After the removal of areas of the layers of the second conductive material, a first etching is done to the first side of the first conductive material. After this first etching of the first conductive material, open areas of the remaining part of the first conductive material are plated with another layer of a third conductive material that forms fourth areas of conductive material. This third layer of conductive material may be resistant to chemicals used in a chemical bath to etch away portions of the first conductive material. Once this plating is done, a second etching is done to the first side of the first conductive material. Once the second etching is completed, dice are coupled to the fourth areas of the third conductive material on the first side of the first conductive material. After the dice are coupled to the fourth areas of the third conductive material, electrical connections are formed between the leads and the dice. At this point, the leads and the die pad are still physically connected by the second side of the first conductive material. After the electrical connections are formed, a molding compound is placed to encase the leads, the die pad, the die and the electrical connections in a semiconductor package. The molding compound leaves surfaces of the leads and the die pad exposed. Once the molding compound has been placed, a third etching is done to the second side of the first conductive material. This third etching on the second side of the first conductive material separates the leads and the die pads from each other forming a lead frame of the semiconductor package.

According to one embodiment, a package is formed having leads, a die pad, a die, a plurality of wires and a molding compound. In this embodiment, the leads include at least one interlocking portion, the die is coupled to the die pad, and the molding compound encases the die pad, the die, the leads, and the electrical connections. Although these components are encased in the molding compound to form semiconductor packages, surfaces of the leads and the die pads are left exposed.

A semiconductor package according to the present disclosure provides a plurality of leads, each lead of the plurality of leads has a first curved portion and a second curved portion, the first curved portion being larger than the second curved portion, the leads being formed by multiple etching steps. The multiple etching steps may utilize chemical etching, reactive ion etching, laser etching, or some other etching technique. Furthermore, die pads are formed by the multiple etching steps as well. By forming the leads and the die pads of the lead frame with multiple etching steps, the leads may be mechanically interlocked within the semiconductor package with greater strength and resilience to external stresses and forces. The leads can be interlocked with greater strength within the semiconductor package because one of the multiple etching steps is an undercut etching step. In this undercut etching step, first curved portions of the leads are formed. These first curved portions have a curvature that allows for the leads to interlock with greater strength in the package because the curvature forms an interlocking portion in the form of a lip, an edge, or a ledge at an end of the leads that is encased in a molding compound of the package. As a result of this multiple etching step process that includes an undercut etching step, the leads have a greater mechanically interlocking effect within the molding compound of the semiconductor package, and in turn, the chances of the leads being pulled out of the package due to external stresses or forces is significantly reduced.

Likewise, by utilizing multiple etching steps, the leads can be formed to have a thickness that is larger than the die pad. By having a die pad that is less thick than the leads, a die is able to sit lower than if the leads and the die pad had the same thickness. In turn, this allows for the wire span of wires to be reduced when the wires are forming electrical connections in the package. As a result of this reduction in wire span of the wires, the chance of wire to wire and wire to die short circuiting is significantly reduced. It is significantly reduced because the wire sweep of the wires is significantly reduced.

One goal is to provide a reliable semiconductor package that can be formed that reduces the number of defects in semiconductor packages due to external stresses or forces, such as lead pull out. Likewise, by reducing the number of defects that result due to external stresses or forces, the number of overall packages that become defective or break when being used in devices exposed to external stresses or forces is significantly reduced.

BRIEF DESCRIPTION OF THE SEVERAL VIEWS OF THE DRAWINGS

In the drawings, identical numbers identify similar elements or acts unless the context indicates otherwise. The sizes and relative positions of elements in the drawings are not necessarily drawn to scale.

FIG. 1 is a cross-sectional side view of a semiconductor package;

FIG. 2A is a bottom plan view of the semiconductor package as shown in FIG. 1 with lead pull out defects;

FIG. 2B is an enlarged bottom plan view of the lead pull out defects as shown in dashed circle of FIG. 2A;

FIG. 2C is an enlarged cross-sectional side view of a lead in some instances of the semiconductor package as shown in FIG. 1;

FIG. 5 is a cross-sectional side view along 5-5 in FIG. 3;

FIGS. 6-14 are cross-sectional side views of successive steps of a method utilizing multiple etching steps to form an embodiment of the semiconductor packages having leads with interlocking portions as shown in FIG. 3;

FIGS. 16-17 are cross-sectional side views of steps in an alternative embodiment of a method utilizing multiple etching steps and a support to form alternative embodiments of semiconductor packages;

FIG. 18 is a cross-sectional side view along 5-5 in FIG. 3 of an alternative embodiment of a completed semiconductor package formed by utilizing a method with multiple etching steps as shown in FIGS. 6-14 or FIGS. 16-17;

FIG. 19 is a cross-sectional side view along 5-5 in FIG. 3 of an alternative embodiment of a completed semiconductor package formed by utilizing a method with multiple etching steps as shown in FIGS. 6-14 or FIGS. 16-17;

DETAILED DESCRIPTION

Figure 3:
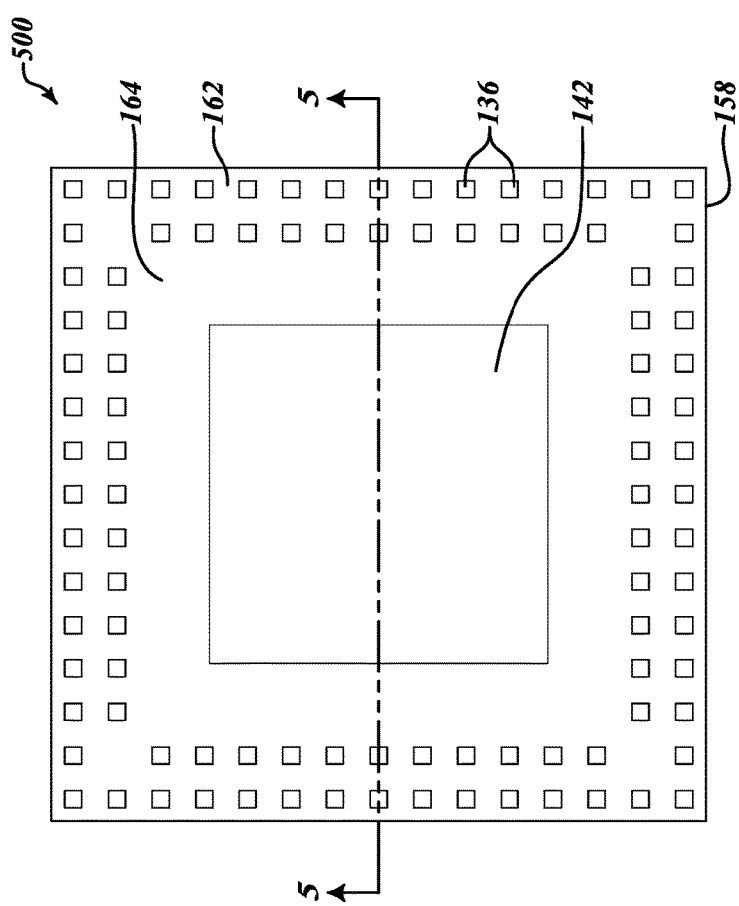
FIG. 3 is a bottom plan view of an embodiment of an inventive completed semiconductor package formed by utilizing a disclosed method with multiple etching steps.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

FIG. 1 shows a semiconductor package 100 formed by a semiconductor package formation process. The package 100 includes a plurality of leads 102, a die pad 108, a plurality of wires 116, a die 118 and a molding compound 124.

In this package 100, the plurality of leads 102 and the die pad 108 have first and second sides that are covered in a second conductive material 104, 106, 110, 112. This second conductive material 104, 106, 110, 112 is resistant to chemicals utilized in chemical etching steps of the formation process. Furthermore, the die 118 is coupled to the die pad 108 by an adhesive material 114. The plurality of leads 102 are electrically coupled to the die 108 by the plurality of wires 116. Each lead of the plurality of leads 102 has a first curved portion 120 and a second curved portion 122. The first curved portion 120 and the second curved portion 122 come together to form an edge 130. In addition, the leads 102 have the same thickness as the die pad 108. Also, the first curved portion 120 and the second curved portion 122 have the same thickness and curvature as well.

To form this semiconductor package 100, a semiconductor package formation process is utilized. In this formation process, a first conductive material has a uniform thickness that is utilized to form the lead frame.

In this formation process, a first and second side of the first conductive material is plated with a second conductive material. This second conductive material is resistant to chemicals used in chemical etching steps. After the first and second sides of the first conductive material have been plated with the second conductive material, portions of the second conductive material are etched away. By etching away portions of the second conductive material, areas of the second conductive material 104, 106, 110, 112 are formed on the first and second sides of the first conductive material. In addition, areas of the first conductive material are now exposed on the first and second sides of the first conductive material. Some of the areas of the second conductive material 110, 112 will be used to form the die pads 108, and some of the areas of the second conductive material 104, 106 will be used to form the leads 102. The areas of the second conductive material 110, 112 used to form the die pads 108 are larger than the areas of the second conductive material 104, 106 that are used to form the leads 102. After the first conductive material is partially exposed, a first chemical etching is carried out. This first chemical etching removes portions from the first side of the first conductive material. These portions of the first conductive material that are removed are located between the areas of the second conductive material 104, 106, 110, 112 and form recesses 132, 134 between the areas of the second conductive material 104, 106, 110, 112. This first chemical etching forms first curved portions 120 of the leads 102 and third curved portions 133 of the die pad 108. In addition, this first chemical etching step begins to form the leads 102 and the die pads 108. After this first chemical etching step, the leads 102 and the die pads 108 are integral the first side of the first conductive material.

After this first chemical etching step, dice 118 are coupled to respective areas of the second conductive material 110 on the first side of the first conductive material that will form the die pads 108. The dice are coupled to respective areas of the second conductive material 110 by an adhesive. Once the dice 118 are in place, a plurality of electrical connections is formed between the leads 102 and the dice 118 by a plurality of wires 116. After the electrical connections are formed, a molding compound 124 is placed to encase the plurality of wires 116, the dice 118, the leads 102 and the die pad 108.

At this point, the die pads 108 and the leads 102 are integral with the first side of the first conductive material and are still physically and electrically connected by the first conductive material. To separate the leads 102 and the die pads 108 into physically and electrically distinct leads 102 and die pads 108, a second chemical etching step is carried out. This second chemical etching step is a backside chemical etching step. In other words, the second side of the first conductive material is exposed to a chemical that etches away portions of the second side of the first conductive material. This backside chemical etching step separates the leads 102 and the die pads 108 so that they are no longer in physical and electrical contact. In other words, this backside chemical etching step forms the finished lead frame of the package 100. In addition, this backside chemical etching step forms the second curved portions 122 of the leads 102 and fourth curved portions 135 of the die pads 108. After this backside chemical etching step, the semiconductor packages 100 are singulated into individual semiconductor packages 100.

In this formation process, the first conductive material, which is a slab or a layer of the first conductive material, is of uniform thickness. This causes the die pad 108 and the leads' 102 of the package to have the same thickness once the package 100 is completed. In order for the packages 100 to not be too large, the first conductive material should be relatively thin allowing for the package 100 to not be overly thick. This allows for the semiconductor package 100 to be mounted within electronic devices.

However, when this formation process is utilized to form the packages 100, as the thickness of the first conductive material is reduced to make the packages 100 even thinner, the chances of lead pull out 128 increases. The chances of lead pull out 128 increases because the leads 102 become much thinner and the recesses 132, 134 that are filled with molding compound 124 are much smaller as shown in FIGS. 2A and 2B. In other words, the interlocking effect of the leads 102 is reduced because the leads 102 do not extend as far into the molding compound 124. Thus, the low profile package reduces the interlocking effect by the molding compound 124 on the leads 102 within the semiconductor package 100.

The inventors have realized that when utilizing the above formation process, the leads are susceptible to lead pull out when the semiconductor packages are being transported due to external stresses, or due to external forces caused by use in an electronic device, such as being dropped. This pull out of the leads may result in less efficient or faulty semiconductor packages. Other difficulties exist as well. First, when forming the molding compound, wires that form electrical connections in the semiconductor package between a die and leads may be displaced or deflected out of place. This movement may result in multiple wires being too close to each other within the final semiconductor package causing short circuiting within the semiconductor package. Second, if multiple dice need to be stacked in the semiconductor package, the chances of wire to wire or wire to die short circuiting increases because the span of the wires is increased. This increase in the span of the wires makes the wires more susceptible to displacement or movement due to the flow of the molding compound while forming the package. Thus, by utilizing wires with a greater span, the cost of manufacturing semiconductor packages is also greater because more material must be utilized to form each semiconductor package.

In addition, if a package 100 with stacked dice is formed by the formation process above, the chances of wire to wire or wire to die short circuiting increases as well. The chance of wire to wire or wire to die short circuiting increases because as multiple die are stacked, the span of the wires 116 increases to form electrical connections within the package 100. As the span of the wires 116 increases, the wires 116 deflection and movement will increase as the molding compound 124 is placed to encase the die 118, the wires 116, the leads 102 and the die pad 108. Thus, when placing the molding compound 124 to form the packages 100, the wires 116 deflect and can get to close or come into direct contact causing wire to wire short circuiting within the package 100. Similarly, when placing the molding compound 124 to form the packages 100, the wires deflect and can get to close to the die 108 causing multiple unwanted electrical connections with the die 108. In turn, causing the semiconductor package 100 to be faulty, unpredictable, less efficient, or all of the above.

This deflection or movement of the wires is known as wire sweep. In other words, wire sweep is the unwanted deflection or movement of wires from their intended location within the semiconductor package 100 caused by the flow of the molding compound 124. Additionally, if the wire sweep of the wires 116 is too great, the wires 116 may get caught between multiple dice 108 if the semiconductor package 100 has a stacked dice configuration.

FIGS. 2A and 2B show a package 100 where lead pull out 128 defects have occurred. In this package 100 of FIGS. 2A and 2B, lead pull out 128 has occurred where the leads 102 were originally located 126. This lead pull out 128 may be the result of external stresses and forces. For example, the package 100 being dropped, vibrating or falling while being transported, or some other external stresses that the package 100 is exposed to may cause lead pull out. In addition, lead pull out 128 may result from testing the package 100 in a drop test to learn how the package 100 would withstand stresses and forces it might be exposed to on a daily basis. This is because these packages 100 may be mounted within electronic devices that are utilized by users on a daily basis, or exposed to external stresses and forces on a daily basis. For example, some such electronic devices may include a calculator, a computer, a tablet, a phone, a remote, a watch, a measurement instrument, a sensor, or any other electronic device. These electronic devices may be exposed to external stresses or forces while the user transports the electronic device, if the user drops the electronic device, or if the device is exposed to other forces and stresses on a daily basis when in use.

This example illustrates the shortcomings that the inventors realized as problems that should be solved in semiconductor packages 100 that utilize a formation process that includes a first chemical etching step and a second chemical backside etching step to form a lead frame of the semiconductor packages 100.

Furthermore, FIG. 2C shows an alternative lead 102 with a shape different than the leads 102 as shown in FIG. 1. The alternative lead's 102 shape is the result of a wet etching that has over etched the lead during the two step etching formation process as discussed earlier. In other words, an over etch has occurred resulting in an undercut etch 121 of the lead. However, this undercut etch 121 is not guaranteed utilizing the two step etching formation process above. For example, the over etching may be the result of an etching being too strong or an etching being allowed to go on for too long. Thus, because this undercut etch 121 is not always assured to occur utilizing the two step etching formation process, the reliability of forming the undercut etch 121 of the lead is not certain.

The present disclosure describes a semiconductor package and formation process that overcomes many of the shortcomings of the semiconductor package 100. The present disclosure describes various embodiments of semiconductor packages being formed by utilizing multiple etching steps to significantly reduce the chances of lead pull out and wire to wire short circuiting.

Figure 4:
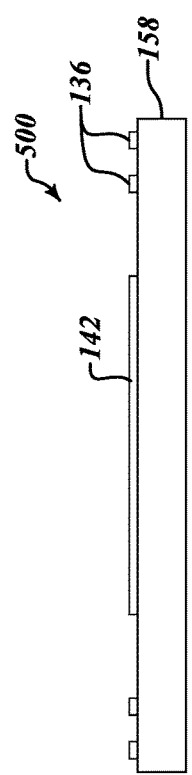
FIG. 4 is a side view of the embodiment of the completed semiconductor package shown in FIG. 3 formed by utilizing the disclosed method with multiple etching steps.

FIGS. 3-5 illustrate one embodiment of the present disclosure for providing a semiconductor package 500 having a lead frame 166 that includes a lead 136 and a die pad 142. Furthermore, the semiconductor package 500 includes a die 152, a plurality of wires 150 and a molding compound 158.

FIG. 3 is a bottom plan view of the semiconductor package 500, the semiconductor package 500 including recesses 162, 164 filled with molding compound 158 between the die pad 142 and the leads 136, and between the leads 136 themselves. FIG. 4 is a side plan view of the semiconductor package 500 as shown in FIG. 3.

Furthermore, FIG. 5 is a cross-sectional side view taken along 5-5 in FIG. 3 of the semiconductor package 500. In this embodiment of the package 500, the leads 136 have a thickness that is greater than the die pad 142 because the leads 136 and the die pad 142 are formed by utilizing at least three etching steps. In addition, the leads 136 include an edge 139 that helps lock the leads 136 into place within the molding compound 158 of the package 500. Furthermore, the leads have a first curved portion 154 and a second curved portion 156, and the die pad has a third curved portion 147 and a fourth curved portion 149. The first curved portion 154 of each lead 136 acts as an interlocking portion 141 that interlocks the leads 136 within the molding compound 158. More specifically, at an end of each lead 136 an interlocking portion 141 interlocks each lead 136 within the molding compound 158 similar to the edge 139 where the first curved portion 154 and the second curved portion 156 of the leads 102 come together. This interlocking portion 141 may be a lip, an edge, a ledge, or some other type of interlocking portion. Also, the leads 136 of a lead frame 166 are made of a first conductive material and have first and second sides covered by a second conductive material. Likewise, the die pad 142 of a lead frame 166 is made of the first conductive material and has a first side covered by a third conductive material and a second side covered by the second conductive material. The first, second, and third conductive materials may be the same conductive material such as gold, copper, aluminum, silver, nickel, palladium, or some other combination of conductive materials or some other conductive material. In addition, the first, second, and third conductive materials may be different conductive materials, some different combination of conductive materials, or the same conductive material.

Additionally, in this semiconductor package 500, the die 152 is coupled to the third conductive material 144 on the first side of the die pad 142. The die 152 is coupled to the third conductive material 144 by an adhesive 148, the adhesive 148 may be a conductive adhesive or a non-conductive adhesive. Also, the adhesive 148 may be a die attach film, a glue, or some other adhesion material or technique. The plurality of wires 150 form electrical connections between the die 152 and the plurality of leads 136. The plurality of wires 150 may be made of copper, gold, silver, or some other conductive material or combinations of conductive materials. Thus, similar to the leads 102 having an edge 139 that helps interlock the leads 102 within the package 500, where the third curved portion 147 and the fourth curved portion 149 of the die pad 142 come together, an edge or interlocking location is formed for the die pad 142 that helps interlock the die pad within the package 500.

FIGS. 6-14 illustrate a method of forming an embodiment of the semiconductor package 500 that includes at least three etching steps. FIG. 6 shows a lead frame 166 of a first conductive material. The lead frame 166 may be in the form of a layer of the first conductive material or a base of the first conductive material. The lead frame 166 has a first side 168 and a second side 170. The first side 168 and the second side 170 are opposite from each other. The lead frame 144 of the first conductive material of the package 500 includes the leads 136 and the die pad 142.

FIG. 7 shows the lead frame 166 of the first conductive material being covered with a first and second layer 172, 174 of a second conductive material. The first and second layer 172, 174 of the second conductive material covers the first and second sides 168, 170 of the lead frame 166 of first conductive material. More specifically, the first layer 172 of the second conductive material is attached, whether by plating, deposition, sputtering, or other techniques, on the first side 168 of the lead frame 166, and a second layer 174 of a second conductive material is attached on the second side 170 of the lead frame 166. The first and second layers 172, 174 of the second conductive material may be resistant to a selective type of chemical etching depending on the etching chemistry and which etching technique is utilized. Likewise, the first and second layers 172, 174 of the second conductive material may act to assist in forming stronger electrical connections. The first and second layers 172, 174 of the second conductive material may be attached to the lead frame 166 of the first conductive material by blanket plating, evaporation deposition, electroplating, or some other plating or deposition technique.

Although as discussed earlier, the etching technique utilized may be any etching technique such as reactive ion etching, laser etching, chemical etching, or some other etching technique, for the purposes of this discussion and method of FIGS. 6-14, the etching steps will be chemical etching steps. Therefore, for the purposes of the following discussion of FIGS. 6-14, the first and second layers 172, 174 of the second conductive material will be a selective chemically resistant conductive material that is unaffected by chemical etching steps applied to the lead frame 166 made of the first conductive material. Furthermore, the lead frame 166 of the first conductive material is a chemically susceptible material that is etched away by the chemical etching steps.

Figure 8:
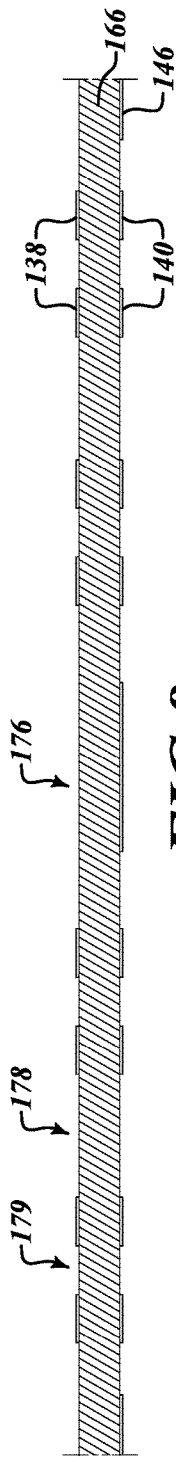
Figure 9:
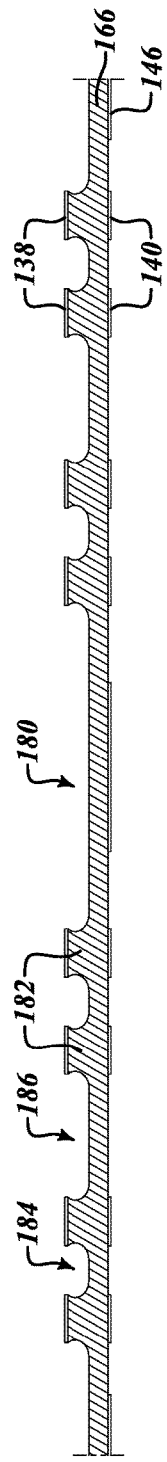

After the lead frame 166 of the first conductive material is plated with the first and second layers 172, 174 of the second conductive material, the first and second layers 172, 174 of the second conductive material are partially etched away to leave areas of the second conductive material 138, 140, 146 on the lead frame 166. In other words, first selected locations 138, 140, 146 on the lead frame 166 are covered by the second conductive material. FIG. 8 shows areas of the second conductive material 138, 140, 146 on the lead frame 166 of the first conductive material. The first areas 138 of the second conductive material are formed by etching the first layer 172 of second conductive material on the first side 168 of the lead frame 166. The second areas 140 and the third areas 146 of second conductive material are formed by etching the second layer 174 of the second conductive material on the second side 170 of the lead frame 166. Etching the layers 172, 174 of the second conductive material may be accomplished by laser etching, reactive ion etching, selective etching, chemical etching, or any other etching technique or combination of etching techniques. The first areas 138 of the second conductive material are aligned with the second areas 140 of the second conductive material. Also, the first areas 138 and the second areas 140 are approximately the same size. The third areas 146 of the second conductive material are larger than the first and the second areas 138, 140 of the second conductive material. The first and second areas 138, 140 of the second conductive material will be utilized later to form the leads 136 of the lead frame 166, and the third areas 146 of the second conductive material will be utilized later to form the die pads 142 of the lead frame 166.

While forming the first, second, and third areas 138, 140, 146 of second conductive material, exposed areas 176, 178, 179 of the lead frame 166 of the first conductive material are formed between these first areas 138 on the first side 168 of the lead frame 166. Also, there are exposed areas formed on the second side of the lead frame 166 of the first conductive material between the second areas 140 and the third areas 146 of the second conductive material. These exposed areas 176, 178, 179 on the first side and the second side of the lead frame 166 will allow for portions of the lead frame 166 of the first conductive material to be removed to form the leads 136 and the die pads 142 of the semiconductor packages 500.

Figure 14:
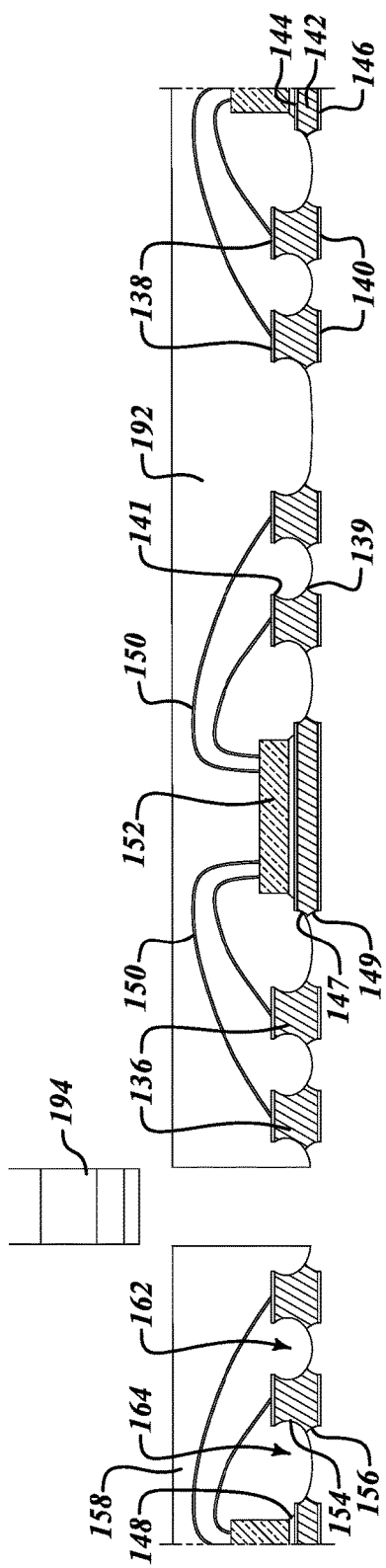

After the first, second and third areas 138, 140, 146 of second conductive material are formed on the first and second sides 168, 170 of lead frame 166 of the first conductive material, a first etching step of the lead frame 166 is carried out. This first etching step of the lead frame 166 made of the first conductive material can be seen in FIG. 9. This first etching step of the lead frame 166 of the first conductive material is preferably a chemical etching step. Alternatively, the first etching step may be accomplished by reactive ion etching, laser etching, or some other etching technique or combination of etching techniques. However, as stated earlier, for the purposes of this process, the process will be described utilizing chemical etching steps. In this first etching step of the lead frame 166, a chemical is applied to the first side 168 of the lead frame 166. More specifically, the exposed areas 176, 178, 179 on the first side 168 of the lead frame 166 of the first conductive material are exposed to the chemical. The chemical may be applied using a chemical bath or some other technique to perform a chemical etching. Once the first side 168 of the lead frame 166 is exposed to the chemical, portions of the first conductive material 166 are removed by the chemical. The second conductive material on the first side 168 of the lead frame 166 is resistant to the chemicals that etch the lead frame 166 of the first conductive material. This second conductive material on the first side 168 of the lead frame 166 protects portions of the lead frame 166 of the first conductive material from being etched away. This protection of portions of the lead frame 166 by the first areas 138 of the second conductive material begins the formation of the leads 136 and the die pad 142. More specifically, the first areas 138 of the second conductive material protecting the portions of the lead frame 166 of the first conductive material allow for the first chemical etching step to form lead portions 182 that are integral the first side 168 of the lead frame 166. The lead portions 182 that are integral of the lead frame 166 of the first conductive material are separated by recesses 184, 186 that are formed by the first chemical etching step. A first plurality of the recesses 184 are formed to allow for the leads 136 to extend into the molding compound 158 and interlock with the molding compound 158 as shown in FIGS. 5, 15, 18, and 19. A second plurality of the recesses 186 are formed to allow for singulation of individual semiconductor packages 500 as shown in FIG. 14. Furthermore, this first chemical etching forms lead portions 182 between these recesses 184, 186. Similarly, after the portions of the lead frame 166 of the first conductive material are removed by the first chemical etching step, open areas 180 are left behind on the first side 168 of the lead frame 166. Each open area 180 is aligned with a respective third area 146 of the second conductive material on the second side 170 of the lead frame 166 of the first conductive material.

After the first etching step, the open areas 180 are plated with a third layer 144 of third conductive material. In other words, second selected locations 144 on the first side 168 of the lead frame 166 are covered by the third conductive material. This can be seen in FIG. 10. More specifically, this third layer 144 of third conductive material forms fourth areas 144 of the third conductive material on the first side 168 of the lead frame 166 of the first conductive material. Each fourth area 144 is aligned with a respective third area 146 of the second conductive material on the second side 170 of the lead frame 166. The fourth areas 144 of the third conductive material are about the same size as the third areas 146 of the second conductive material. The third layer 144 of the third conductive material may be resistant to a selective type of chemical etching depending on the etching chemistry and which etching technique is utilized. More specifically, similar to the second conductive material, this third conductive material on the first side 168 of the lead frame 166 protects portions of the lead frame 166 of the first conductive material from being etched away. Additionally, the third layer 144 of the third conductive material may be the same selective chemically resistant conductive material as the first and second layers 172, 174 of the second conductive material or may be a different selective chemically resistant conductive material than the first and second layers 172, 174 of the second conductive material. However, as stated earlier, it is assumed for this discussion that the third conductive material is a selective chemically resistant conductive material. Furthermore, the fourth areas 144 of the third conductive material and the third areas 146 of conductive material will be utilized to form the die pads 142 of the lead frame 166 later. Additionally, the dimensions $d_1$, $d_2$ and $d_3$ may be made any size or length based on how the size and position of the areas 138, 140, 144, 146 of the second and third conductive material on the first side 168 of the lead frame 166 of the first conductive material are formed and positioned. This flexibility in dimensions $d_1$, $d_2$ and $d_3$ allows for packages 500, 502, 504 to be made with any number of leads 136 or die pads 142 as desired.

After the fourth areas 144 of the third conductive material have been formed on the first side 168 of the lead frame 166 of the first conductive material, a second etching step of the lead frame 166 is carried out. This second etching step of the lead frame 166 of the first conductive material can be seen in FIG. 11. This second etching step of the lead frame is preferably a chemical etching step. Alternatively, this second etching step of the lead frame 166 of the first conductive material may be any etching technique such as reactive ion etching, laser etching, chemical etching, or some other etching technique. However, as stated earlier, for the purposes of this process, the process will be described utilizing chemical etching steps, and therefore, this second etching step of the lead frame 166 of the first conductive material is a second chemical etching step. More specifically, this second chemical etching step of the lead frame 166 is an undercut etching step because it forms interlocking portions 141 of each lead 136. This second chemical etching step increases the depth of the recesses 184, 186 and increases the thickness of the lead portions 182 that are integral the lead frame 166 of the first conductive material. Furthermore, this second chemical undercut etching step forms the first curved portion 154 of each lead 136 of the lead frame 166 of the first conductive material. Also, the second chemical undercut etching step forms die pad portions 188 that are integral the lead frame 166 of the first conductive material. In addition, the second chemical undercut etching step forms curved portion 190 between the lead portions 182 and each respective die pad portion 188. This curved portion 190 between the lead portions 182 and the die pad portions 188 will help the die pad 142 be locked within the semiconductor package 500 by being in contact with the molding compound 158. Also, this second chemical undercut etching step of the lead frame 166 of the first conductive material forms the interlocking portion 141 at an end of each lead portion 182 or lead 136 that will extend into the molding compound 158, 192. See FIGS. 12 and 15. The interlocking portion 141 may be a lip, an edge, a ledge, or some other interlocking portion. In this second chemical etching step, this second and third conductive materials on the first side 168 of the lead frame 166 protects portions of the lead frame 166 of the first conductive material from being etched away.

After the second chemical etching step of the lead frame 166 of the first conductive material, dice 152 are coupled to each fourth area 144 of the third conductive material. This can be seen in FIG. 12. More specifically, each die 152 is coupled to a respective fourth area 144 of the third conductive material. The die 152 is coupled to the respective fourth area 144 of the third conductive material by an adhesive 148. This adhesive 148 may be a conductive material or a non-conductive material. Furthermore, the adhesive may be a die attach film, a glue, or some other adhesive or coupling technique.

After the dice 152 have been coupled to the fourth areas 144 of the third conductive material, electrical connections are formed. This can be seen in FIG. 12. Electrical connections are formed by a plurality of wires 150. Each wire 150 has a respective first end coupled to a respective lead portion 182 and a respective second end coupled to a respective die 152. Each lead portion 182 has a wire bond surface located on the end furthest from the second side 170 of the lead frame 166 of the first conductive material. The wires 150 may be placed by a wire-bond attach process, wire bonding, or some other technique. Also, the electrical connections may be formed by wires or some other electrical connection. The wires 150 may be made of copper, silver, gold or some other conductive material or combination of conductive materials.

After the electrical connections have been formed by the plurality of wires 150 between the lead portions 182 and the dice 152, a molding compound 192 is placed encasing the dice 152, the wires 150, the lead portions 182, and the die pad portions 188. This can be seen in FIG. 12. Furthermore, the molding compound 192 fills the recesses 184, 186 and the curved portions 190 between the lead portions 182 and the die pad portions 188. Once the molding compound 192 has been placed, the molding compound is allowed to cure. The molding compound 192 may be a non-conductive epoxy material or an encapsulant that is formed through compression molding, injection molding, or some other formation technique. Additionally, the molding compound 192 fills singulation recesses 186 to form singulation locations 193. The mold is not shown, since these are well known in the art.

After the dice 152 have been coupled to the fourth areas 144 of the third conductive material, the electrical connections have been formed by wires 150, and the molding compound 192 has been placed and cured, the third etching step of the lead frame 166 of the first conductive material is carried out. This can be seen in FIG. 13. This third etching step of the lead frame 166 of the first conductive material is preferably a chemical etching step. Alternatively, this third etching step of the lead frame 166 of the first conductive material may be any etching technique such as reactive ion etching, laser etching, chemical etching, or some other etching technique. However, as stated earlier, for the purposes of this process, the process will be described utilizing chemical etching steps, and therefore, this third etching step is a third chemical etching step. More specifically, this third chemical etching step of the lead frame 166 of the first conductive material is a backside chemical etching step. Since the lead portions 182 and the die pad portions 188 are still integrated within the lead frame 166 of the first conductive material, and are physically and electrically coupled together by the second side 170 of the lead frame 166 of the first conductive material, the third backside chemical etching step is carried out to separate the lead portions 182 and the die pad portions 188 from each other. In other words, by doing this third backside chemical etching step of the lead frame 166 of the first conductive material, the leads 136 and the die pads 142 of the lead frame 166 of the first conductive material of the semiconductor package 500 are formed. This third backside chemical etching step of the lead frame 166 of the first conductive material, removes portions of the second side 170 of the lead frame 166 between the lead portions 182 and the die pad portions 188 forming the leads 136 and the die pads 142 of the lead frame 166. Furthermore, this third chemical backside etching step forms second portions 156 of the leads 136 that allow for mounting of the semiconductor package 500 within electronic devices such as cellphones, tablets, computers, calculators, and other such electronic devices. In this third etching step, the second and third areas 140, 146 of the second conductive material protect portions of the lead frame 166 of the first conductive material from being etched away.

After the backside chemical etching step of the lead frame 166 of the first conductive material is completed, the semiconductor packages 500 are singulated into individual semiconductor packages 500. This can be seen in FIG. 14. The semiconductor packages 500 are singulated by a cutting device 194. The cutting device 194 may be a saw, a laser, or some other cutting or singulation device. The cutting device 194 singulates the semiconductor packages 500 at the singulation locations 193 where the molding compound 192 has filled the singulation recesses 186 into individual semiconductor packages 500.

Figure 15:
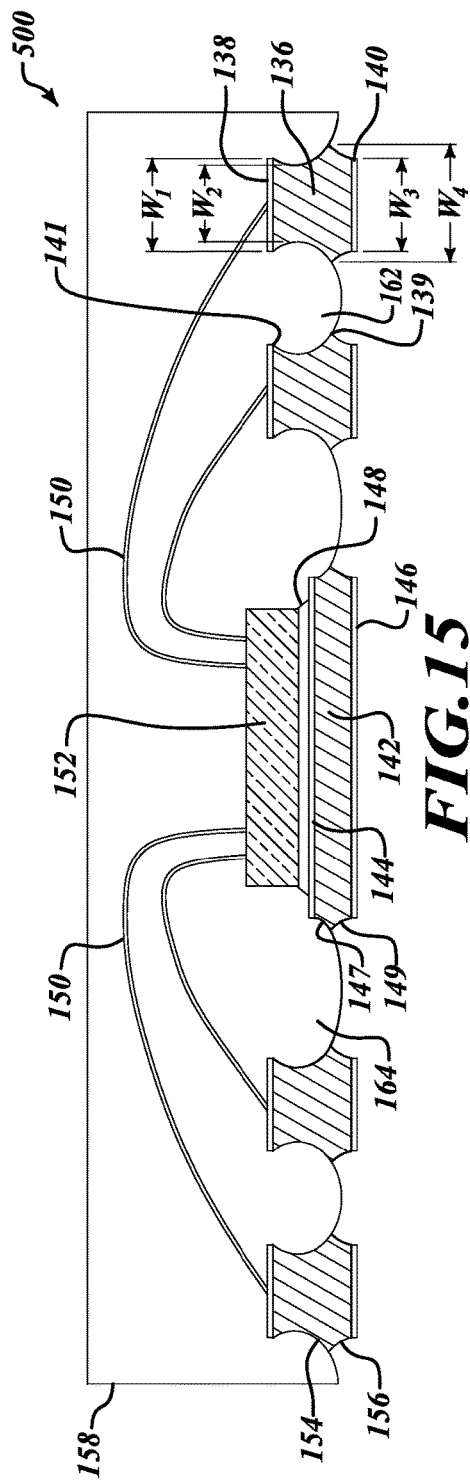
FIG. 15 is a cross-sectional side view along 5-5 in FIG. 3 of an embodiment of a completed semiconductor package formed by utilizing a method with multiple etching steps.

FIG. 15 is an embodiment of a completed semiconductor package 500. This embodiment of the completed semiconductor package 500 can be seen in FIG. 5 as well. By utilizing the method in FIGS. 6-14, this embodiment of the semiconductor package 500 can be formed. In this embodiment, the leads 136 have a thickness that is greater than the die pad 142 because the leads 136 and the die pad 142 are formed using at least three etching steps. See FIGS. 6-14. These at least three etching steps allow for the leads 136 to have a thickness larger than the die pad 142. Because the leads 136 are able to have a thickness larger than the die pad 142, the span of the wires 150 can be reduced between the die 152 and the leads 136. The span of the wires 150 can be reduced because the die 152 is coupled to the fourth area 144 of the third conductive material which is coupled to the die pad 142, and because the die pad has a thickness lesser than the leads 136, this causes the die 152 to sit slightly lower than if the die pad and the leads were to have the same thickness as in the semiconductor package 100. In turn, as a result, the distance between the electrical contact points on the die 152 and the wire bond surfaces of the leads 136 is reduced and the wire span of the wires 150 is reduced as well. Therefore, by utilizing the method in FIGS. 6-14 the wire span of the wires 150 can be reduced, and in turn, the chances of wire to wire short circuiting is reduced as well because wire sweep is reduced when placing a molding compound 158, 192.

Similar to wire span of the wires 150 being reduced, which reduces the chances of wire to wire short circuiting, in this embodiment of the semiconductor package 500, the chances of lead pull out 128 defects is reduced as well. See FIGS. 2A and 2B. The chances of lead pull out 128 defects is reduced because the first curved portion 154 of the leads 136 has a length that extends further into the molding compound 158 than in the semiconductor package 100. In addition, by performing an undercut etching step of the lead frame 166 of the first conductive material, the leads 136 have an interlocking portion 141 at the end of the first curved portion 154, which is encased in the molding compound 158. The interlocking portion 141 may be a lip, an edge, a ledge, or some other interlocking portion. Similarly, by utilizing this method in FIGS. 6-14, the leads also have an edge 139 where the first curved portion 154 and the second curved portion 156 of each lead comes together to help lock the leads 136 within the molding compound 158 of the semiconductor packages 500 as well. Additionally, 139 is the point at which the molding compound 158, 192 meets each lead. Thus, by utilizing this formation process with at least three etching steps, the leads 136 have a higher tolerance and resilience to external stresses and forces. In turn, this higher tolerance and resilience reduces the chance of lead pull out 128 defects resulting in less efficient and faulty semiconductor packages as discussed earlier in regards to FIGS. 2A and 2B.

Likewise, when utilizing the method of FIGS. 6-15, the undercut etch leads 136, which are desired, are guaranteed to have an undercut etch. Unlike in FIG. 2C where an over etching can result in an undercut etch 121 in only some instances, in the method above that utilizes three etching steps, the undercut etch of each lead 136 is guaranteed to occur. For example, even if an unskilled operator were to perform the above method utilizing three etching steps, the undercut etch would result with high reliability. Whereas if an unskilled operator were to utilize a method that uses only one etch on the molding side of the lead frame, the undercut etch 121 would only occur in those instances as a result of a wet etch that also carried out some over etching. Thus, the forming of an undercut region during an etch of the prior art is not reliable or certain in all instances. On the other hand, using the disclosed method steps herein, the undercut etch of each lead 136 is reliably formed in each instance. In an alternative method, a support 196 may be utilized to allow for a die pad 142 to be made even thinner and a first curved portion 154 of a lead 136 to have even greater curvature using the above semiconductor package formation process. In turn, allowing the lead 136 to have a greater undercut etch forming a stronger interlocking portion 189 of the leads 136 as concave surfaces resulting in a greater interlocking effect of the leads 136 within the molding compound 158 of the semiconductor packages 502, 504 as shown in FIGS. 18 and 19. This alternative method can be seen in FIGS. 16 and 17.

In this alternative method, the steps are similar to the method in FIGS. 6-14. However, in this alternative method in FIGS. 16 and 17, a support 196 is coupled to the second side 170 of the lead frame 166 of the first conductive material after the first, second, and third areas 138, 140, 146 of the second conductive material have been formed on the first and second sides 168, 170 of the lead frame 166 of the first conductive material. By coupling the support 196 to the second side 170 of the first conductive material 166, the first side 168 of the lead frame 166 of the first conductive material can be etched even further back in the at least three etching steps. More specifically, the first etching step can be made much stronger. The first etching step can be increased in strength because the support 196 will allow for the lead portions 182 and the die pad portions to be supported while being formed. In addition, the support 196 allows for a stronger second etching step as well. The second etching step is an undercut etching step. This support 196 allows for the die pad portion 188 to be made extremely thin. In addition, this support 196 allows for the curvature of the first curved portion 154 of the leads 136 to be made extremely large. This large curvature of the first curved portion 154 of each lead 136 allows for the interlocking portion 189 to have a greater interlocking effect since it will have a larger undercut etch to interlock with the molding compound 158, 192. More specifically, this larger undercut etch will form a stronger interlocking portion 189 at an end of each lead 136 of the lead frame 166 of the first conductive material. In addition, this larger undercut etch will allow for more molding compound 158, 192 to flow into the larger undercut etch creating a stronger interlocking effect. The interlocking portion 189 will be stronger because the leads 136 will have a greater undercut etch in the form of concave sides which forms an interlocking portion 189 that will have a greater interlocking effect. This interlocking portion 189 may be a lip, an edge, a ledge, or some other interlocking portion. This support 196 may be a lead frame tape, a removable substrate, or some other removable support.

By utilizing the support 196, the die 152 will sit lower than using the method in FIGS. 6-14 because the die pad 142 will be even thinner. This will allow the wire span of the wires 150 to be reduced significantly because the die will sit much lower compared to the leads 136. In addition, this allows for dice 152 to be stacked on each other while maintaining the wires 150 shorter wire span. Additionally, if the method to form the semiconductor package 100 was used to form a stacked die semiconductor package, while trying to maintain the thinness of the package 100, the leads and die pad would have to be made more thin which would result in a higher chance of lead pull out. With this alternative method in FIGS. 16-17, the leads 136 can still maintain their structural integrity and even interlock with greater strength than in the method in FIGS. 6-14 while reducing the thickness of the semiconductor packages 500, 502, 504 and maintaining a short wire span of the wires 150.

Both methods above form undercut etch leads 136 that have a width of a widest portion $W_1$, a width of a narrowest portion $W_2$, a width at a point where the molding compound 158 meets each lead $W_4$, and a width of an electrical contact surface 140 of each lead $W_3$. As shown in FIG. 15, in a preferred embodiment, the molding compound 158 is formed past $W_2$ of each lead 136, but this is not required in all cases. In addition, in this preferred embodiment in FIG. 15, the widest portion $W_1$ will generally be located at a top surface of each lead 136, but this is not required in all cases. In the preferred embodiment, $W_2$ is located between $W_1$ and $W_4$, but this is not required in all cases.

FIG. 15 illustrates the preferred embodiment because the leads 136 are interlocked within the molding compound 158 with greater strength and integrity than if $W_2$ was positioned outside the molding compound 158 of the semiconductor package 500. Additionally, $W_2$ is located between $W_1$ and $W_4$. However, in other embodiments, $W_2$ may be outside the molding compound 158, $W_2$ may be the same as the width $W_4$ at the point at which the molding compound 158 meets each lead 136, or $W_2$ may be positioned at some other location of each lead 136. Also, the electrical contact surface 140 can have any shape or size. For example, the electrical contact surface may be a rectangle, a square, a triangle, a circle, or any other shape.

In addition, the leads 136 can be formed to have convex sides or concave sides 154, 156. In a preferable embodiment, all of the sides of the leads 136 are concave shaped 154, 156. In other words, the leads 136 that have an undercut etch have concave sides 154, 156 as shown in FIG. 15. Although each lead 136 having all sides 154, 156 be concave in shape is preferable, this is not required in all cases. For example, in other embodiments, the leads 136 may have a single concave side and multiple convex sides, multiple concave sides and multiple convex sides, or any combination of concave sides and convex sides as desired. The concave and convex sides 154, 156 may be formed by the undercut etching step as set out in both of the methods earlier, or some other etching technique.

Furthermore, the leads 136 with an undercut etch may be formed to have any shape or size. For example, the leads 136 may have a shape such as a trapezoid, a triangle, a slopped inward shape, an hourglass shape, or any other shape that would allow for the leads 136 to be interlocked within the molding compound 158 with greater strength and integrity. However, in the embodiments shown, an hourglass like lead shape is demonstrated in FIG. 15.

In addition, although the leads 136 with the undercut etch may be formed to have any shape or size as discussed above, when utilizing the three step etching formation process above, $W_1$ will always be larger than $W_2$ resulting in a lead 136 with an undercut etch.

FIG. 18 is an alternative embodiment of a semiconductor package 502 formed utilizing the alternative method in FIGS. 16-17. This alternative embodiment of the semiconductor package 502 includes leads 136, a die pad 142, a plurality of wires 150, a die 152, and a molding compound 158. The difference between this alternative embodiment of the semiconductor package 502 and the embodiment of the semiconductor package 500 in FIGS. 5 and 15 is that the first curved portion of the leads 154 has a larger curvature due to a stronger second etching step, which is an undercut etching step. This allows for edge 191 in the alternative embodiment to have a greater interlocking effect and allows for the interlocking portion 189 to have a greater interlocking effect as well. The interlocking portion 189 may be a lip, an edge, a ledge, or some other interlocking portion. Both the edge 191 and the interlocking portion 189 have a greater interlocking effect due to the increased curvature of the first curved portion 154 of each lead 136. In turn, this alternative embodiment of the semiconductor package 502 further reduces the chances of lead pull out. In addition, in this alternative embodiment of the semiconductor package 502, the die pad 142 is much thinner than the die pad 142 in the embodiment of the semiconductor package 500 in FIGS. 5 and 15. This again allows for the wire span to be kept small and even reduced because the die 152 in this alternative embodiment of semiconductor package 502 will sit lower than die 152 in the embodiment of the semiconductor package 500 in FIGS. 5 and 15 where the die pad 142 is thicker.

FIG. 19 is an alternative embodiment of a semiconductor package 504. It has all of the same benefits as the alternative semiconductor package 502 in FIG. 18. In addition, it has all of the same components as in FIG. 18 as well, except for a second die 200 that is coupled to the first die 197 by an adhesive 198. The adhesive 198 may be a conductive adhesive or a non-conductive adhesive. Furthermore, the adhesive may be a die attach film, a glue, or some other adhesive or coupling technique. Furthermore, electrical connections are formed between the dice 197, 200 and the leads by a plurality of wires 150. These electrical connections may be formed by other electrical connection techniques. Also, the leads 136 have a thickness that is approximately equal to the sum of the die pad's thickness 142 and the stacked dice's 197, 200 thicknesses. In alternative embodiments, the leads 136 may have a thickness that is greater than the sum of a die pad's thickness and stacked dice's thicknesses.

In alternative embodiments, the leads 136 may have a thickness that is approximately equal to the sum of a die pad's thickness and any number of dice's thicknesses. In other words, the leads 136 may have a thickness that is approximately equal to, slightly less than, or slightly greater than the sum of the die pad's thickness and the stacked die's thicknesses.

Figure 20:
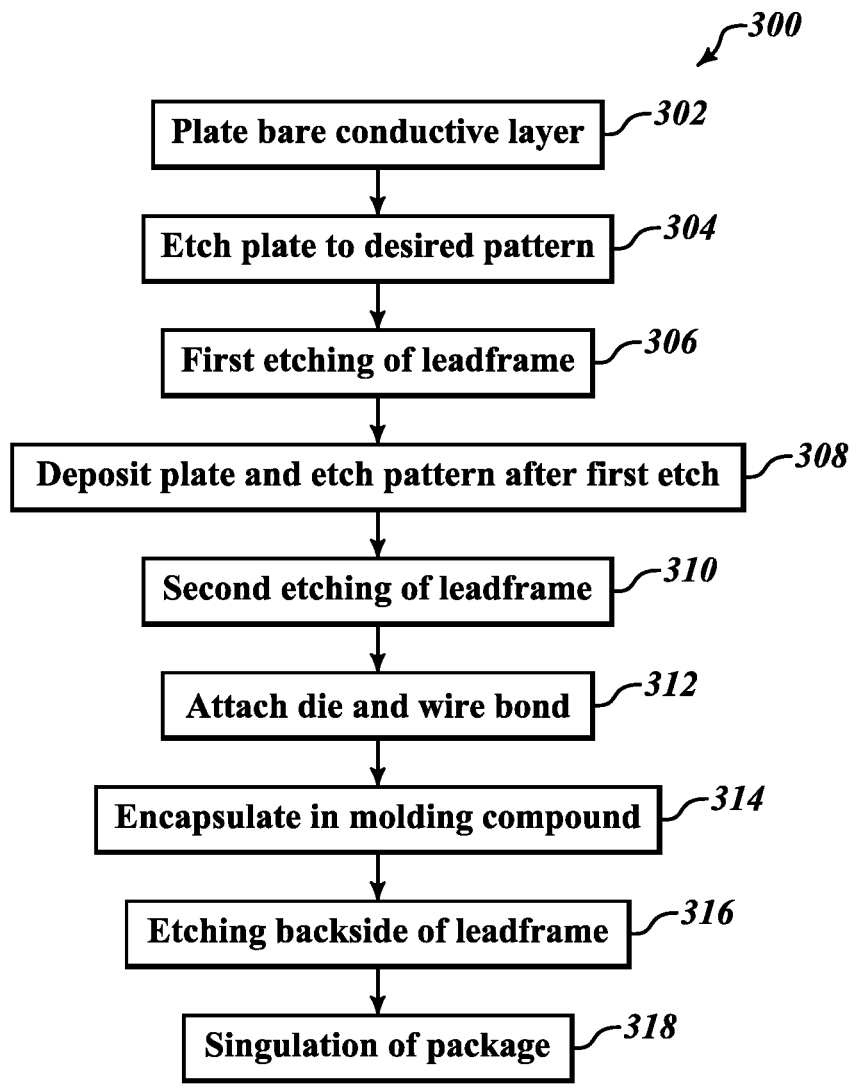
FIG. 20 is a flow chart diagram of successive steps of a semiconductor package formation process utilizing multiple etching steps according to FIGS. 6-14.

FIG. 20 is a flow chart 300 of the method set out in FIGS. 5-14. More specifically, FIG. 20 shows a flow chart diagram 300 summarizing a method of manufacturing hundreds, thousands, or any number of packages 500, 502, 504 in a large array at one time using at least three etching steps to form semiconductor packages 500, 502, 504 that have strong interlocking leads 136, and wires 150 with short wire spans.

The first step 302 is to attach a first and second layer 172, 174 of a second conductive material to a lead frame 166 of a first conductive material. This lead frame 166 of the first conductive material may have a uniform thickness. The first and second layers 172, 174 of the second conductive material may be a selectively chemically resistant conductive material or a selectively non-chemically resistant conductive material. The step 302 is shown in FIG. 7. The first and second layers 172, 174 of the second conductive material is plated onto the first and second sides 168, 170 of the lead frame 166 of the first conductive material. More specifically, a first layer 172 and a second layer 174 of the second conductive material are plated onto the first and second sides 168, 170 of the lead frame 166 of the first conductive material. The second conductive material may be plated by utilizing laser deposition, electroplating, evaporation deposition, blanket deposition, or some other plating technique for applying a thin layer of material. The second conductive material may be a selectively chemically resistant conductive material that is resistant to chemical etching steps.

Once the first and second sides 168, 170 of the lead frame 166 of the first conductive material are plated with a second conductive material, the next step 304 is the etch plate to desired pattern step. This step corresponds to FIG. 8. In this step 304, portions of the first and second layers 172, 174 of the second conductive material are etched away to form first areas 138 of the second conductive material on the first side 168 of the lead frame 166 of the first conductive material, and second and third areas 140, 146 of the second conductive material on the second side 170 of the lead frame 166 of the first conductive material. Each first area 138 of the second conductive material is aligned with a respective second area 140 of the second conductive material. The first and second areas 138, 140 of the second conductive material in combination with the multiple etching steps will form the leads 136 of the lead frame 166 of the first conductive material. In addition, after etching portions of the first and second layers 172, 174 of the second conductive material from the first and second sides 168, 170 of the lead frame 166 of the first conductive material, areas 176, 178, 179 of the lead frame 166 of the first conductive material are exposed as well. In other words, this etching plate step leaves a desired pattern of the second conductive material 138, 140, 146 on the first and second sides 168, 170 of the lead frame 166 of the first conductive material.

Once the desired pattern of the second conductive material is formed, the next step 306 is the first etching of the lead frame 166 of the first conductive material. This step is shown in to FIG. 9. In this step 306, portions of the first side 168 of the lead frame 166 of the first conductive material are etched away. This first etching step 306 may be a reactive ion etching, a laser etching, a chemical etching, or some other etching technique. This first etching step 306 forms open areas 180 on the first side 168 of the lead frame 166 of the first conductive material aligned with the third areas 146 of the second conductive material on the second side 170 of the lead frame 166. Additionally, this first etching step 306 forms recesses 184, 186 between the first areas 138 of the second conductive material on the first side 168 of the lead frame 166 of the first conductive material. Also, this first etching step 306 forms lead portions 182 aligned with the first and second areas 138, 140 of the second conductive material.

Figure 10:
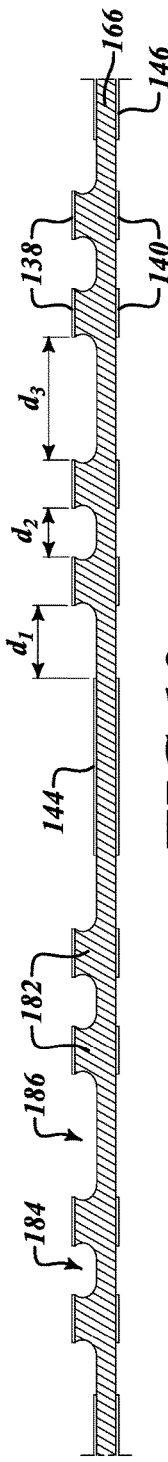

Once the first etching step is completed, the next step 308 is a deposit plate and etch pattern after first etching. This step is shown in FIG. 10. In this step 308, a third conductive material 144 is plated onto the open areas 180 of the first side 168 of the first conductive material 166. This third conductive material 144 may be plated onto the open areas 180 of the lead frame 166 of the first conductive material using a plating technique. For example, laser deposition, vapor deposition, selective plating, or some other plating technique. The third conductive material 144 may be a selectively chemically resistant conductive material. After the third conductive material 144 is plated onto the open areas 180, portions of the third conductive material 144 are etched away to form fourth areas 144 of the third conductive material on the first side 168 of the lead frame 166 of the first conductive material. These fourth areas 144 of third conductive material are aligned with the third areas 146 of the second conductive material on the second side 170 of the lead frame 166 of the first conductive material. Alternatively, these fourth areas 144 of the third conductive material may be formed by a selective plating technique. For example, laser deposition, vapor deposition, or some other selective plating technique.

Once the deposit plate and etch pattern after first etching is complete, the next step 310 is a second etching of the lead frame 166 of the first conductive material. This step is shown in FIG. 11. This second etching step is an undercut etching step. In other words, the undercut etch forms a first curved portion 154 of the leads 136 that has a curvature. This second etching step may be a second chemical etching step. More specifically, this second etching step may be done by utilizing a chemical bath or some other chemical etching technique. Alternatively, this second etching step may be a reactive ion etching, a laser etching, or some other etching technique. The curvature of the first curved portion 154 can be controlled by this second undercut etching step by controlling the strength and/or duration of this second undercut etching step 310. In other words, the curvature of the first curved portion 154 can be increased or decreased by controlling this second etching step 310. By increasing the curvature of the first curved portion 154, the leads 136 will have a much greater interlocking effect once a molding compound 158, 192 encases the leads. More specifically, when the curvature of the first curved portion 154 of the leads 136 is greater, the molding compound 158, 192 is able to flow into the undercut etch of the lead 136, which acts as the interlocking portion 141, 189, and in turn, the lead is interlocked within the molding compound with greater strength than if the lead 136 had a lesser undercut etch or curvature. This is because this undercut etch forms an interlocking portion 141, 189 that may be in the form of a lip, an edge, a ledge, or another form of interlocking portion 141, 189 that has an interlocking effect once the molding compound 158, 192 is placed.

Once the second etching of the lead frame is completed, the next step 312 is an attach die and wire bond step. This step can be seen in FIG. 12. In this step 312, dice 152 are coupled to the fourth areas 144 of the third conductive material on the first side 168 on the lead frame 166 of the first conductive material. The dice 152 may be coupled to the fourth areas 144 of the third conductive material by an adhesive 148. The adhesive 148 may be a non-conductive adhesive or a conductive adhesive. Also, the adhesive 148 may be a die attach film, a glue, or some other adhesion or coupling technique. After the dice 152 are attached to the fourth areas 144 of third conductive material, electrical connections are formed. Electrical connections are formed by a plurality of wires 150, each wire 150 having a respective first end coupled to a respective lead 136 and a respective second end coupled to a respective die 152.

Once the attach die and wire bond step is completed, the next step 314 is encapsulating the components of the semiconductor packages 500, 502, 504 in a molding compound 192. This step can be seen in FIG. 12. The molding compound 192 is placed to encase the plurality of wires 150, the die 152, and the first curved portions 154 of the leads 136. The molding compound may be an encapsulant, a non-conductive epoxy molding compound, or some other packaging material.

After the molding compound step is completed, the next step 316 is an etching backside of the lead frame step. This step can be seen in FIG. 13. In this step 316, a third etching step 316 is done to the second side 170 of the first conductive material 166. This third etching step 316 may be a third backside chemical etching step 316. More specifically, this third etching step 316 may be done by utilizing a chemical bath or some other chemical etching technique. Alternatively, this third backside etching step 316 may be a reactive ion etching, a laser etching, or some other etching technique. This third backside etching step 316 forms the second curved portion 156 of each lead 136. This second curved portion 156 acts as an interlocking portion to keep the leads 136 in place similar to the curvature of the first curved portion 154 of the leads 136. In addition, this third backside etching step 316 separates the die pad 142 and the leads 136 physically and electrically from each other forming the completed lead frame 166 of the first conductive material. Also, the third backside etching step 316 forms fourth curved portions 149 of the die pads 142.

After the etching backside of the lead frame step 316, the next step 318 is singulation of packages. This step can be seen in FIG. 14. In this step 316, semiconductor packages 500, 502, 504 are singulated into individual packages 500, 502, 504. The individual packages 500, 502, 504 may be singulated by a cutting device 194. The cutting device 194 may be a saw, a laser, or some other cutting device or technique. This package singulation step 316 may be done by the individual who produces the package or may be done at another time and by a different individual. The packages are singulated at a singulation location 193.

Figure 21:
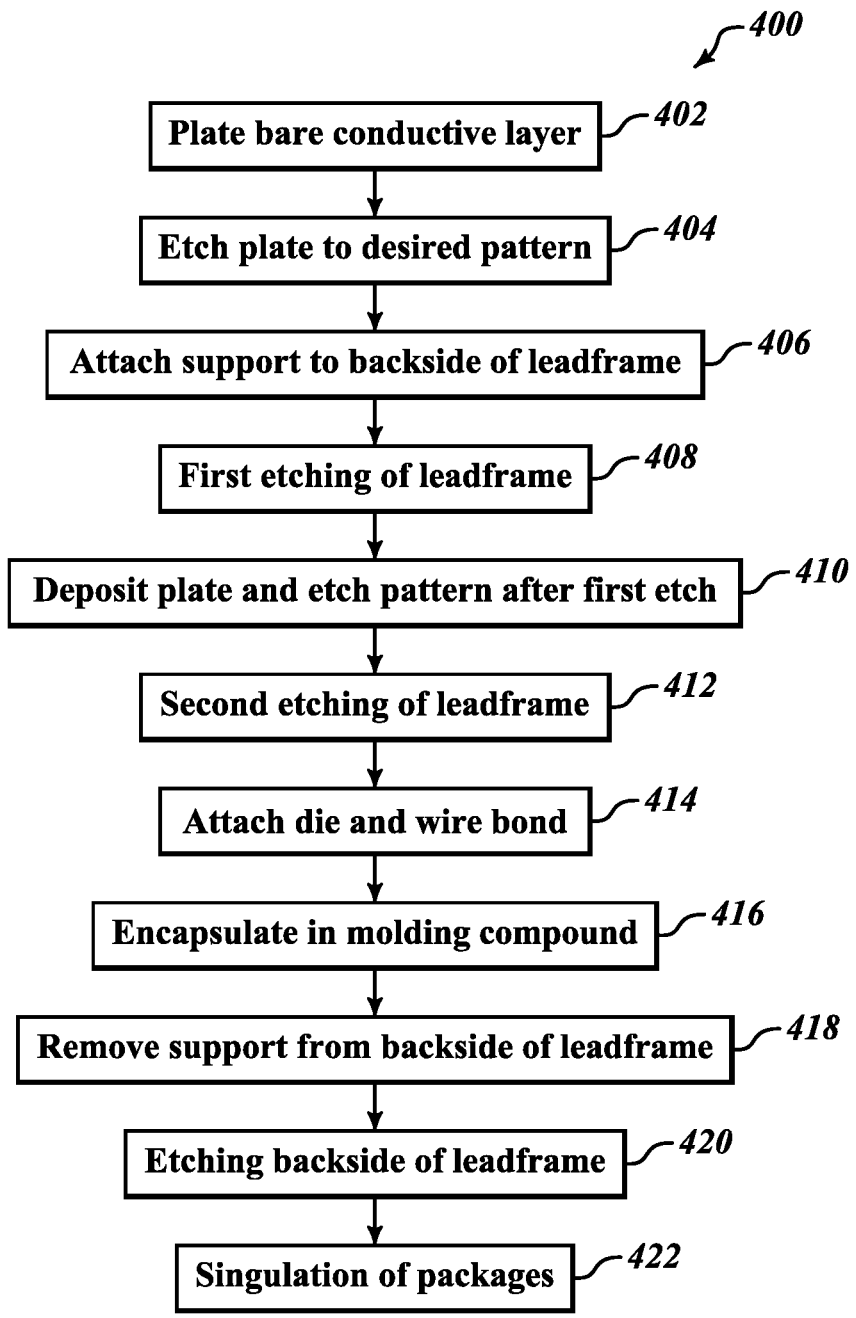
FIG. 21 is a flow chart diagram of successive steps of an alternative semiconductor package formation process utilizing multiple etching steps and a support according to FIGS. 16-17.

FIG. 21 is a flow chart 400 of the alternative method set out in FIGS. 16-17. This method is similar to the method set out in flow chart 300 in FIG. 20. This flow chart 400 of an alternative method has all of the same steps as the flow chart 300 except for two additions. The steps of this method including a plate bare conductive layer step 402, a etch plate to desired pattern step 404, a attach support to backside of lead frame step 406, a first etching of lead frame step 408, a deposit plate and etch pattern after first etch step 410, a second etching of lead frame step 412, a attach die and wire bond step 414, a encapsulate in molding compound step 416, a remove support from backside of lead frame step 418, an etching backside of lead frame step 420, and a singulation of packages step 422.

Between the etch plate to desired pattern step 304, 404 and the first etching of lead frame step 306, 408, there is an attach support to backside of lead frame step 406. This step can be seen in FIG. 16. In this step 406, a support 196 is attached to the second side 170 of the lead frame 166 of the first conductive material after the first, second, and third areas 138, 140, 146 of the second conductive material have been formed on the lead frame 166. The support 196 is utilized to allow for the lead frame 166 to be supported while it is etched in the first etching of the lead frame step 408. Unlike the first etching of the lead frame step 306 in flow chart 300, in this alternative method, the first etching step is much stronger. In other words, the first etching step removes more material from the lead frame 166 of the first conductive material than the first etching of the lead frame step 306 in the flow chart 300. This allows for the die pads 142 of the lead frame 166 to be made even thinner increasing the thickness differential between the die pads 142 and the leads 136. Additionally, the support 196 allows the second etching of the lead frame 412 to form leads 136 with a greater undercut etch. In other words, the second etching of the lead frame step 412 can be stronger than in the flow chart 300. This allows the first curved portion 154 of each lead 136 to have a greater curvature and results in a greater interlocking effect of each lead 136. This is because the undercut etch is greater and forms an interlocking portion 189 having a form of an edge, a lip, a ledge, or an interlocking portion that has a greater curvature and has a greater interlocking effect when encased in molding compound 158, 192.

The other step in this alternative method 400, which is not in the flow chart 300 of FIG. 20, is the remove support from the backside of the lead frame step 418. This step 418 is between the encapsulate in molding compound step 416 and the etching backside of lead frame step 420. This remove support step 418 is located between these two steps 416, 420 because it allows for the leads 136 to be supported while the molding compound 158, 192 is placed to avoid defects or breaks in the leads 136 as the molding compound 158, 192 is placed.

By utilizing the methods disclosed above, individual semiconductor packages are manufactured in batches of hundreds, thousands, or any number as needed. Also, the number of lead pull out defects that result in these packages due to external stresses or forces is reduced. The chance of lead pull out defects is reduced because by using the above disclosed methods, leads have a better interlocking effect within the molding compound. There is a better interlocking effect within the molding compound because the curvature of the leads is much greater and forms interlocking portions that are encased in the molding compound of the packages. Likewise, by utilizing the above disclosed methods, the span of wires may be reduced because a die pad of the lead frame is much thinner and shorter than leads of a package. Thus, dice will sit lower when coupled to the thinner die pads, and the distance between electrical contacts of the dice and the wire bond surfaces of the leads is reduced. This reduction in distance allows for wires of shorter length to be utilized. By utilizing wires with shorter overall lengths, wire to wire short circuiting defects are reduced while the molding compound is being placed because the shorter wires will deflect less and move less as the molding compound encases components of semiconductor packages. In other words, the wire sweep of the wires is reduced. Thus, the packages manufactured by the above disclosed methods will cost less as less material for the wires will be needed to form electrical connections in the semiconductor packages.

Additionally, when utilizing the above formation processes to form semiconductor packages 500, 502, 504, a ring groove is formed on the semiconductor package 500, 502, 504. For example, a ring groove is formed between the leads 136 and the die pads 142 where the molding compound 158 fills recesses 164 between the leads 136 and the die pads 142. This would allow an aqua ring to be coupled to the semiconductor package 500, 502, 504 at this location allowing for the die pad to be sealed off from liquids, gases, or undesired materials or compounds. Likewise, the aqua ring may be placed at a location between the leads 136 where the molding compound 158 fills recesses 162 between the leads 136. This would protect the leads 136 and the die pads 142 from being exposed to liquids, gases, or other undesired materials or compounds. Additionally, an aqua ring may be positioned at the edge of the semiconductor package 500, 502, 504 as well.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of forming a semiconductor package, comprising:
   forming a first layer of a first conductive material at a first set of locations on a first side of a lead frame corresponding to first portions of leads;
   forming a second layer of the first conductive material at a second set of locations on a second side of the lead frame;
   removing first portions of the lead frame at locations not covered by the first set of locations by a first etching;
   forming a third layer of a second conductive material at a third location on the lead frame after removing the first portions of the lead frame;
   removing second portions of the first side of the lead frame that are not covered by the first conductive material or the second conductive material by a second etching after forming the third layer of the second conductive material;
   coupling a die to the lead frame at the third location;
   forming electrical connections between the first portions of the leads and the die;
   encapsulating the lead frame and the die in a molding compound that encases the first portions of the leads, the die and the electrical connections;
   removing portions of the second side of the lead frame by a third etching; and
   singulating the die encapsulated in the molding compound into the package.

2. The method of forming the semiconductor package of claim 1, wherein the lead frame is made of a selectively chemically susceptible conductive material.

3. The method of forming the semiconductor package of claim 2, wherein the first and the second conductive materials are selectively chemically resistant conductive materials.

4. The method of forming the semiconductor package of claim 3, wherein the first and the second conductive materials are the same selectively chemically resistant conductive material.

5. The method of forming the semiconductor package of claim 3, wherein the first and the second conductive materials are different selectively chemically resistant conductive material.

6. The method of forming the semiconductor package of claim 1, wherein forming electrical connections between the first portions of the leads and the die includes forming a plurality of wires, each wire having a respective first end coupled to a respective lead and a respective second end coupled to the die.

7. The method of forming the semiconductor package of claim 1, wherein removing first portions of the lead frame at those locations not covered by the first set of locations by the first etching includes chemically etching first portions of the lead frame at those locations not covered by the first set of locations.

8. The method of forming the semiconductor package of claim 1, wherein removing second portions of the first side of the lead frame that are not covered by the first conductive material or the second conductive material by the second etching includes chemically etching second portions of the first side of the lead frame that are not covered by the first conductive material or the second conductive material.

9. The method of forming the semiconductor package of claim 1, wherein removing portions of the second side of the lead frame by the third etching includes chemically etching portions of the second side of the lead frame.

10. The method of forming the semiconductor package of claim 1, further comprises:
    coupling a support to the second side of the lead frame after forming a second layer of the first conductive material at a second set of locations on a second side of the lead frame; and
    removing the support from the second side of the lead frame after encapsulating the lead frame and die in a molding compound that encases the first portions of the leads, the die and the electrical connections.

11. A method of forming a semiconductor package, comprising:
    depositing a first conductive material at a plurality of first areas on a first side of a lead frame;
    depositing a second conductive material at a plurality of second areas on a second side of the lead frame;
    etching the first side of the lead frame in a first etching sequence to remove first portions of the lead frame between the first areas of the first conductive material;
    depositing a third conductive material at a plurality of third areas on the first side of the lead frame after etching the first side of the lead frame in the first etching sequence;
    etching the first side of the lead frame in a second etching sequence to remove second portions of the lead frame between the first areas of the first conductive material and the third areas of the third conductive material after depositing the third conductive material;
    placing a plurality of die on the third areas of the third conductive material on the first side of the lead frame;
    depositing a molding compound on the plurality of die and the first side of the lead frame;
    etching the second side of the lead frame in a third etching sequence to remove third portions of the lead frame between the second areas; and singulating the lead frame and the plurality of die and the molding compound on the lead frame into the package.

12. The method of forming the semiconductor package of claim 11, further comprising coupling a plurality of wires to the plurality of die and the first side of lead frame.

13. The method of forming the semiconductor package of claim 11, wherein each etching is a chemical etching.

14. The method of forming the semiconductor package of claim 13, wherein the first conductive material, the second conductive material, and the third conductive material are selectively chemically resistant conductive materials.

15. The method of forming the semiconductor package of claim 11, wherein etching the second side of the lead frame in the third etching sequence to remove third portions of the lead frame between the second areas is a backside etching.

16. The method of forming the semiconductor package of claim 11, wherein a support is coupled to the second side of the lead frame.

17. A method of forming a semiconductor package, comprising:
    placing a first conductive material on a first side of a lead frame;
    placing a second conductive material on a second side of the lead frame;
    applying a first chemical to the first side of the lead frame to remove first portions of the lead frame;
    placing a third conductive material on the first side of the lead frame after applying the first chemical to the first side of the lead frame to remove first portions of the lead frame;
    applying a second chemical to the first side of the lead frame to remove second portions of the lead frame after placing the third conductive material;
    coupling a die to the third conductive material on the first side of the lead frame;
    placing a plurality of electrical connections between the die and the first side of the lead frame;
    placing a molding compound on the first side of the lead frame to encapsulate the die and the plurality of electrical connections; and
    applying a third chemical to the second side of the lead frame to remove third portions of the lead frame.

18. The method of forming the semiconductor package of claim 17, wherein the plurality of electrical connections are a plurality of wires.

19. The method of forming the semiconductor package of claim 17, wherein applying the third chemical to the second side of the lead frame to remove third portions of the lead frame forms a plurality of leads and a die pad.

20. The method of forming the semiconductor package of claim 17, wherein the first chemical, the second chemical, and the third chemical are an etching chemical and the first conductive material, the second conductive material, and the third conductive material are chemically resistant to the etching chemical.

21. A method of forming a semiconductor package, comprising:
    forming a first layer of a first conductive material at a first set of selected locations on a first side of a lead frame corresponding to first portions of leads;
    forming a second layer of the first conductive material at a second set of selected locations on a second side of the lead frame;
    coupling a support to the second side of the lead frame after forming a second layer of the first conductive material at a second set of selected locations on a second side of the lead frame;
    removing first portions of the lead frame at those locations not covered by the first set of selected locations by a first etching;
    forming a third layer of a second conductive material at a third selected location on the lead frame;
    removing second portions of the first side of the lead frame that are not covered by the first conductive material or the second conductive material by a second etching;
    coupling a die to the lead frame at the third selected location;
    forming electrical connections between the first portions of the leads and the die;
    encapsulating the lead frame and the die in a molding compound that encases the first portions of the leads, the die and the electrical connections;
    removing the support from the second side of the lead frame after encapsulating the lead frame and die in a molding compound that encases the first portions of the leads, the die and the electrical connections;
    removing portions of the second side of the lead frame by a third etching; and
    singulating the die encapsulated in the molding compound into the package.

22. The method of forming the semiconductor package of claim 11, wherein removing first portions of the lead frame and removing second portions of the lead frame by chemical etching.

23. The method of forming the semiconductor package of claim 21, wherein the first conductive material and the second conductive material are selectively chemically resistant conductive materials.

* * * * *